United States Patent [19]
Kucera et al.

[11] Patent Number: 5,343,405
[45] Date of Patent: Aug. 30, 1994

[54] AUTOMATIC EXTRACTION OF PULSE-PARAMETRICS FROM MULTI-VALUED FUNCTIONS

[75] Inventors: Dennis W. Kucera, Beaverton; Paul S. Meyers, Aloha, both of Oreg.

[73] Assignee: Tektronix, Inc., Wilsonville, Oreg.

[21] Appl. No.: 784,085

[22] Filed: Nov. 1, 1991

Related U.S. Application Data

[63] Continuation of Ser. No. 498,231, Mar. 23, 1990, abandoned.

[51] Int. Cl.[5] .................... G06F 15/74; G01R 29/02
[52] U.S. Cl. ............................... 364/486; 364/487; 324/76.13
[58] Field of Search .................. 364/486, 487, 514; 324/77 R, 77 A, 111, 113, 140 R

[56] References Cited

U.S. PATENT DOCUMENTS

| | | | |
|---|---|---|---|
| 4,495,585 | 1/1985 | Buckley | 364/487 |
| 4,758,963 | 7/1988 | Gordon et al. | 364/487 X |
| 4,774,682 | 9/1988 | White | 324/77 A X |
| 4,779,044 | 10/1988 | Skolnick et al. | 324/77 R |
| 4,827,259 | 5/1989 | Murphy et al. | 364/487 X |
| 4,843,562 | 6/1989 | Kenyon et al. | 364/487 |
| 4,876,655 | 10/1989 | Carlton et al. | 369/487 |
| 4,901,009 | 2/1990 | Schultz et al. | 364/487 X |
| 4,985,844 | 1/1991 | Foley et al. | 364/487 |
| 5,083,282 | 1/1992 | Katayama et al. | 364/487 |

Primary Examiner—Thomas G. Black
Assistant Examiner—Michael Zanelli
Attorney, Agent, or Firm—Francis I. Gray

[57] ABSTRACT

Automatic extraction of pulse parametrics from multi-valued functions, such as a digital serial communications signal, is achieved by building up an eye pattern data array from multiple acquisitions of the multi-valued functions. One axis of the data array represents amplitude and another represents time, and the contents of each element of the array represents the number of times a data point occurs within the amplitude-time interval represented by the element during the multiple acquisitions. After the data array has been built, histograms representing summations of selected elements of the data array are obtained. From the histogram information the pulse parametrics are determined, such as amplitude levels for the various states of the signal as well as the characteristics of transition paths between states.

16 Claims, 17 Drawing Sheets

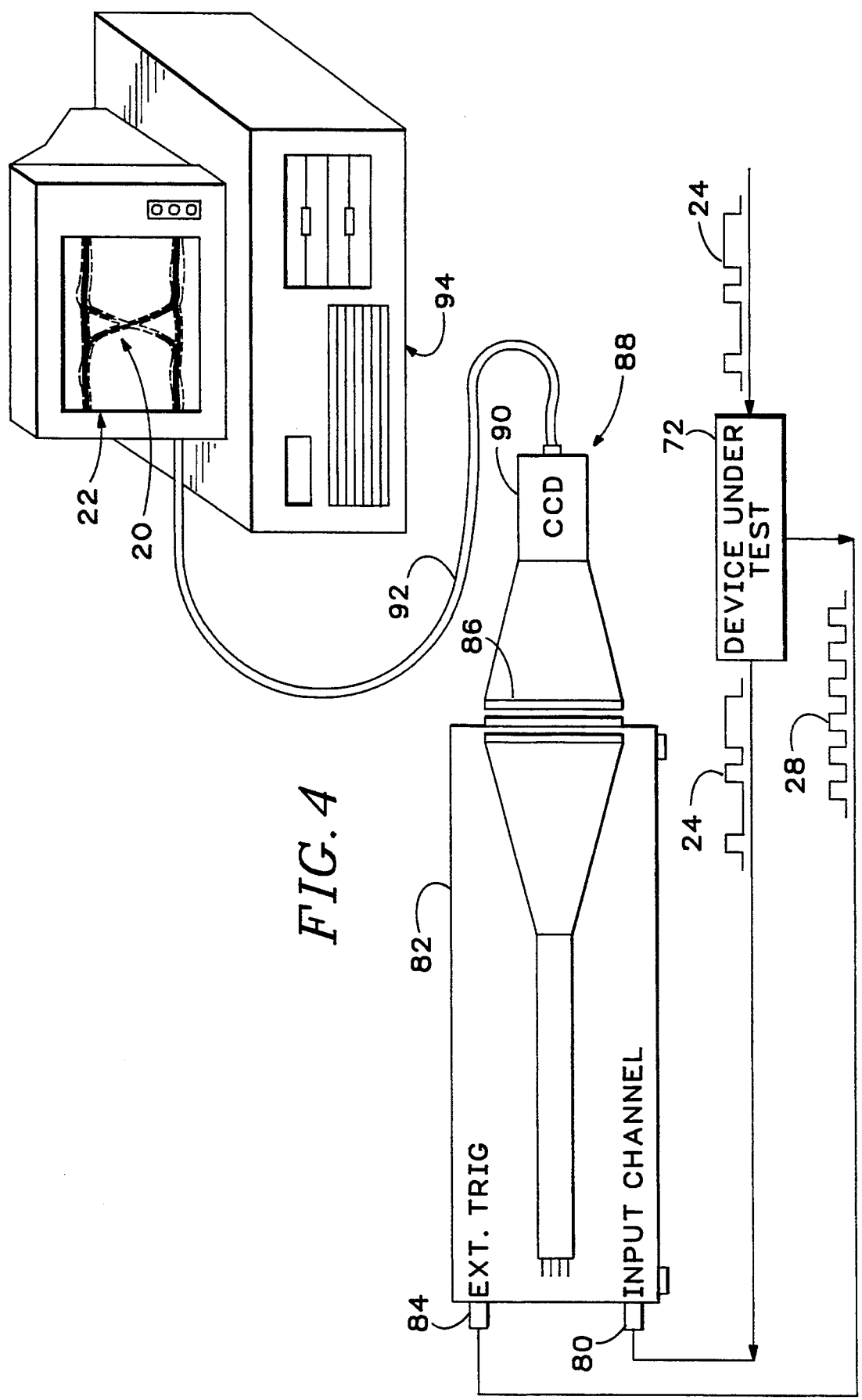

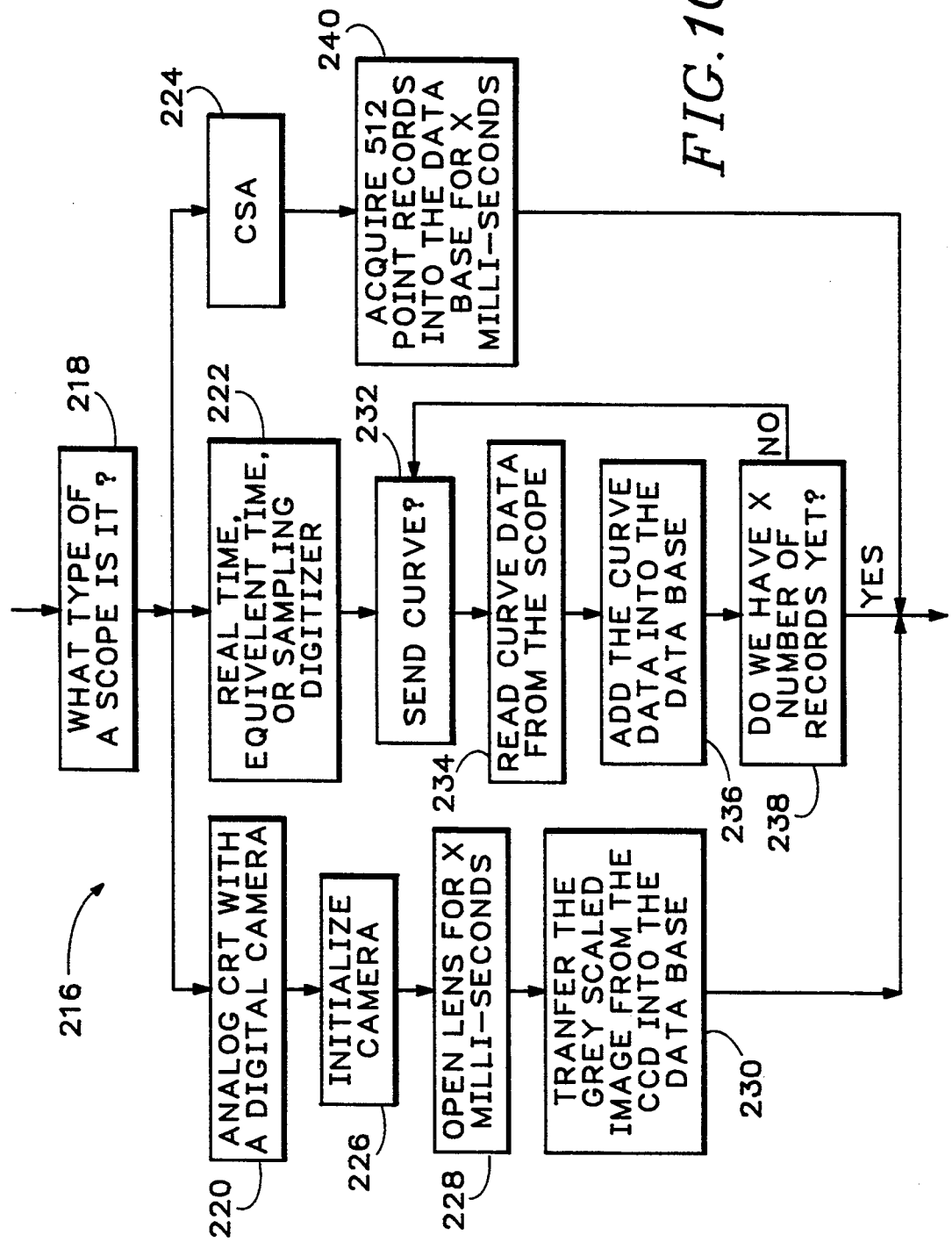

AUTOMATIC EXTRACTION OF PULSE-PARAMETRICS FROM MULTI-VALUED FUNCTIONS

This is a continuation of application Ser. No. 07/498,231 filed Mar. 23, 1990 and now abandoned.

BACKGROUND OF THE INVENTION

The present invention relates generally to signal testing, and particularly to performance characterization of multi-valued functions, such as digital communication signals.

Periodic signals are easily evaluated on, for example, an oscilloscope where the oscilloscope triggers a display sweep relative to a voltage level of the signal under test, or relative to a trigger signal in phase with the signal under test. Because the signal is cyclic and each display screen begins at the same point in the signal cycle, the same display pattern, i.e., the same portion of the signal cycle, appears on the oscilloscope for each display sweep. The display pattern thereby presents for analysis a stable image of the signal cycle.

A digital communication signal is not so easily evaluated on an oscilloscope. A digital communication signal is typically a bi-state signal, but is not cyclic. The signal changes state in accordance with the stream of data it carries, and for purposes of analysis might just as well be a random pattern of state transitions. When applied to an oscilloscope, such a signal will not produce single-valued wave form, i.e., such as a clock signal which has a single valid voltage for each time ordinate. Therefore, traditional waveform analysis cannot be applied thereto. Each display sweep presents a different portion of essentially a random pattern of state transitions. The display image, repeating display sweeps of different portions of the signal, provides a multi-valued picture of the signal and provides what is called "eye pattern".

In an eye pattern, the high and low states of the signal appear as substantially horizontal traces across the oscilloscope screen. State transitions are not completely random. Each transition potentially occurs relative to a conversion clock signal. Thus, if a state transition occurs, it happens at a known time relative to the conversion clock signal. By triggering the oscilloscope with the conversion clock signal, the state transitions of the communication signal appear at substantially the same locations on the oscilloscope display. The resulting pattern is an open area, the eye, bounded on the top and bottom by the high and low state levels, respectively, and on each side by state transition traces. The state transitions on each side of the opening generally cross and form an "X" shape on each side of the eye. One component of each "X" shape corresponds to high-to-low transitions and the other component corresponds to low-to-high transitions. The distance between the high and low states, the slope of the state transition, overall size of the open area, and other similar measurements aid in characterizing the communication signal producing the eye pattern.

A manual method of characterizing an eye pattern is known. According to this method, one generates an eye pattern on the oscilloscope screen, marks the screen with a grease pencil to identify certain portions of the eye pattern, and visually measures relative positions of the identified portions. While such information provides a basis for characterizing the signal, it must be gathered manually and, therefore, comes with the expense of human labor and the possibility of human error.

Due to the random nature of a digital communication signal, automation of signal characterization is not possible according to known methods as applied to cyclic signals. Accordingly, it would be desirable to provide an automatic method of characterizing digital communication signal analysis.

SUMMARY OF THE INVENTION

It is, therefore, an object of the present invention to automatically evaluate an eye pattern to avoid the cost of human labor and risk of human error. Automatic characterization of a communication signal provides immediate feedback to an operator of test equipment. The effects of signal adjustment, as received or as transmitted, are readily available without an intermediate manual computation.

The foregoing objects and advantages are achieved in a method of signal characterization, in accordance with the present invention, wherein signal amplitude is sampled during a sample period to generate a sequence of data value pairs, a first value of each data value pair corresponding to a signal amplitude and a second value of each data value pair corresponding to a time interval of the sampling period. The data value pairs correspond to address value pairs for addressing an accumulator data structure. The accumulator data structure is first initialized and the signal is sampled for a given number of sample periods. For each data value pair obtained, the corresponding accumulator is incremented. The signal is then characterized by the total held in each accumulator.

In accordance with one aspect of the invention, the high and low states of the signal are determined by summing accumulators in rows corresponding to common signal amplitudes through the sample periods. Two groupings or bands of adjacent accumulator rows will show summation peaks and thereby indicate the high and low states for the signal. By summing selected ones of accumulator bands at predetermined positions relative to the high and low states, e.g., at a given percentage of the distance between the high and low states, transition states are identified and characterized.

The subject matter of the present invention is particularly pointed out and distinctly claimed in the concluding portion of this specification. Both the organization and method of operation of the invention, together with further advantages and objects thereof, however, may best be understood by reference to the following description and accompanying drawings wherein like reference characters refer to like elements.

BRIEF DESCRIPTION OF THE DRAWINGS

FIGS. 3–5 illustrate application of a digital communication signal to test equipment, in accordance with the present invention, for characterizing the communication signal;

FIGS. 8–10 are flow charts showing steps for characterizing a digital communication signal.

DETAILED DESCRIPTION OF THE INVENTION

Figure 1:
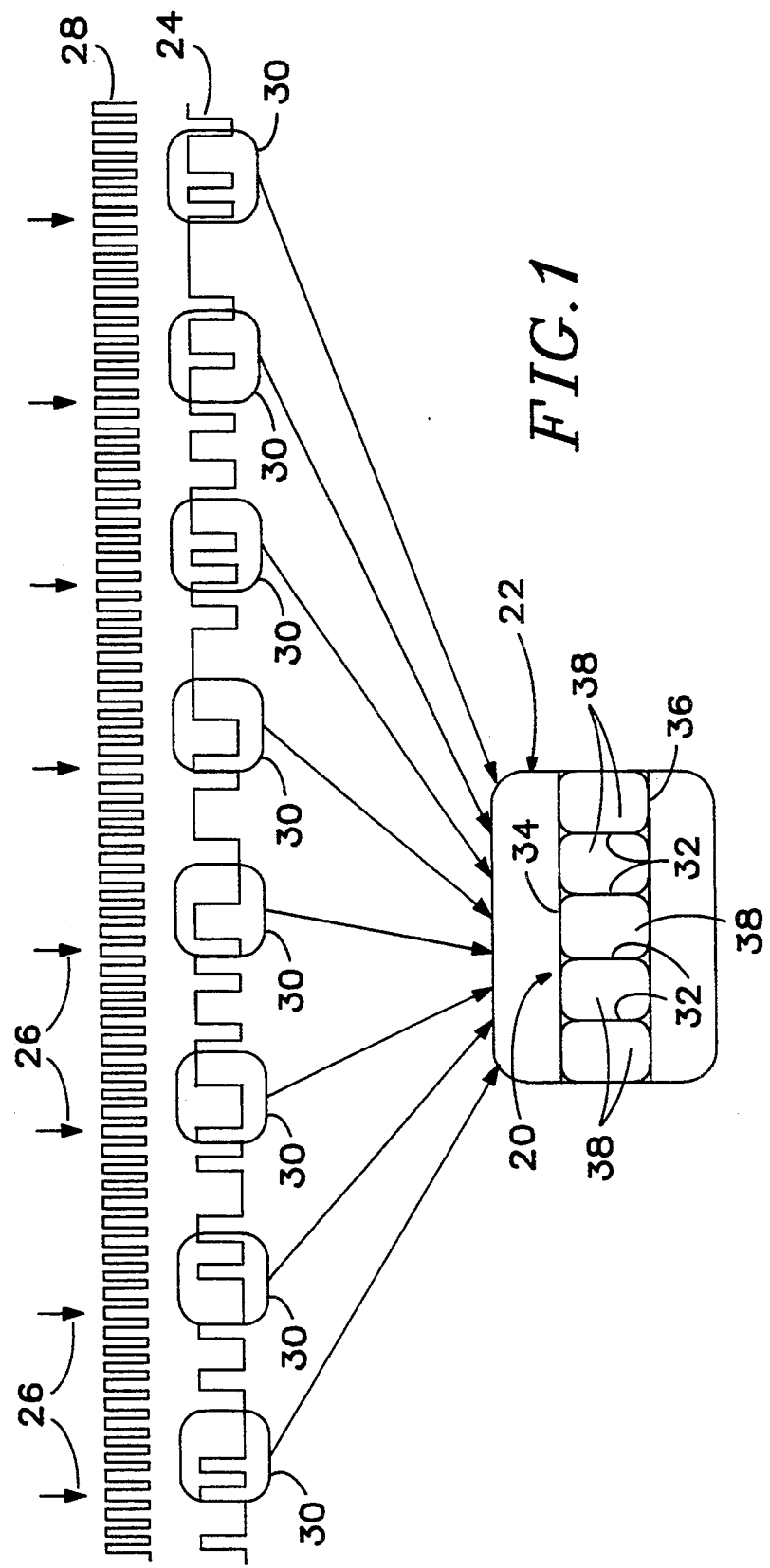
FIG. 1 illustrates the generation of an eye pattern on an oscilloscope screen by monitoring a digital communication signal and triggering the oscilloscope with an associated clock signal.

FIG. 1 illustrates the generation of an eye pattern 20 on an oscilloscope screen 22. A digital communication signal 24 is applied to the oscilloscope (not shown in FIG. 1) to produce the eye pattern 20. Each display sweep of the oscilloscope begins at a trigger point 26 relative to a clock signal 28. As shown in FIG. 1, for each trigger 26, a corresponding portion 30 of signal 24 is traced across the oscilloscope display 22. Thus, the eye pattern 20 may be visualized by overlaying each of the portions 30 of signal 24. The eye pattern 20 includes transition states 32 occurring at substantially fixed locations within the oscilloscope display 22. Such transition states may be high-to-low or low-to-high transitions between a high state 34 and a low state 36. The eye pattern 20 includes open regions, or eyes 38, bounded on each side by transition states 32 and bounded above and below by high and low states 34 and 36, respectively.

It will be understood that the communication signal 24 represents a broad range of random or pseudo-random data streams. For example, the signal 24 could be trans-oceanic telephone data, as well as communication between components of a digital circuit. Communication signal 24 may be an optical signal, in which case references herein to signal amplitude are meant to include reference to similar characteristics, e.g., wattage for optical signals. In any case, signal 24 carries data and, for purposes of analysis, is substantially random in nature. Because such signals are substantially random in nature, a typical display image obtained is an eye pattern. The subject matter of the present invention concerns automatic analysis and characterization of such eye patterns.

Figure 2:
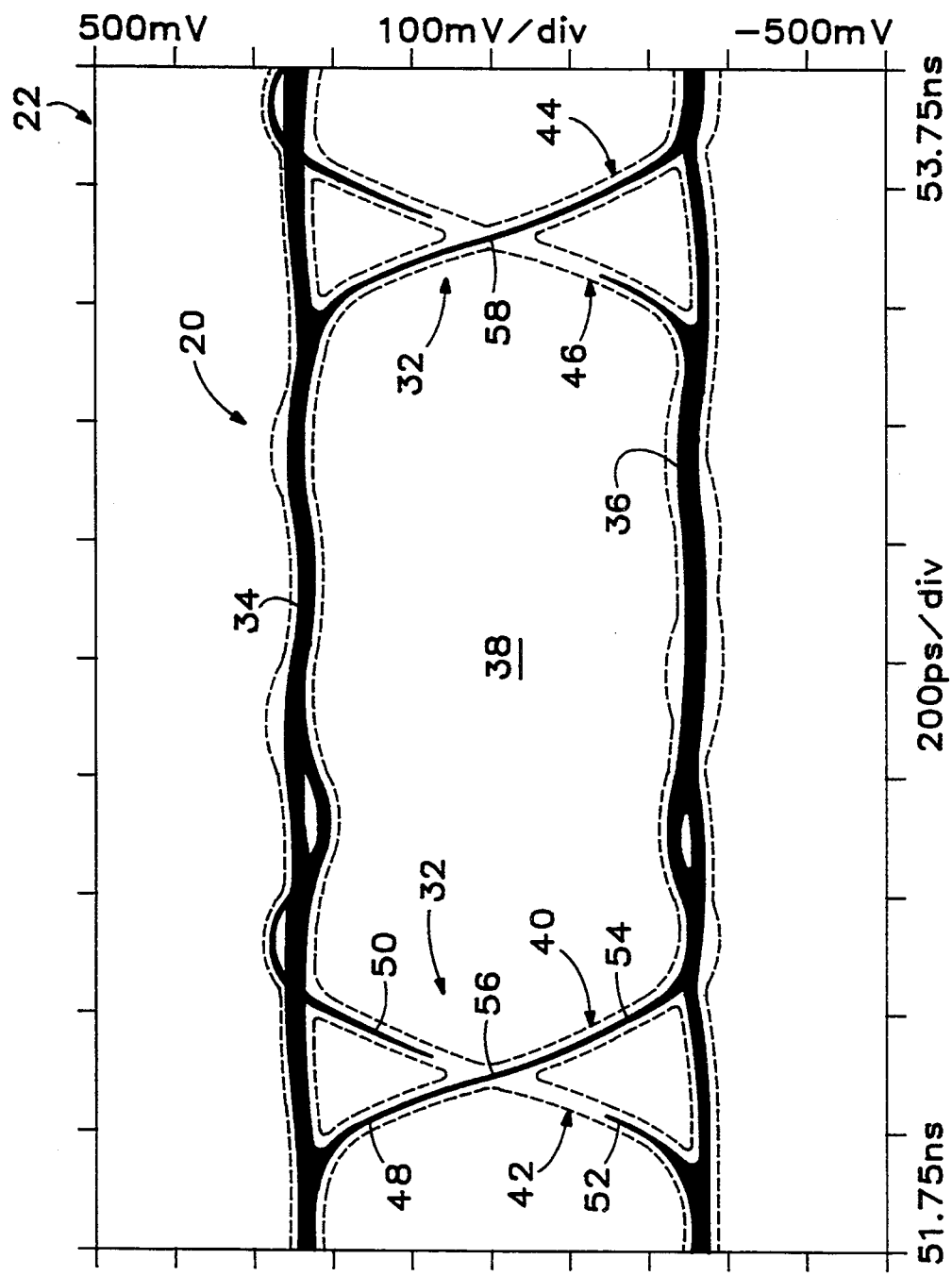
FIG. 2 illustrates display of an eye pattern on an oscilloscope and identifies certain portions of the eye pattern useful for signal characterization.

FIG. 2 illustrates oscilloscope display 22 presenting eye pattern 20. The eye pattern 20 includes an eye 38 bounded above by high state 34 of signal 24, and below by low state 36 of signal 24. A transition state region 32 preceding eye 38 includes a high-to-low transition path 40 and a low-to-high transition path 42. A similar transition state region 32 following the eye 38 includes a high-to-low transition path 44 and a low-to-high transition path 46. It will be appreciated that for any given trigger 26 taken from clock signal 28, a substantially arbitrary portion 30 (FIG. 1) of signal 24 is traced across the oscilloscope display 22. For a given trigger 26, the oscilloscope may trace a signal across high state 34, across low state 36, or through one of the transition paths 40, 42, 44, or 46. The nature of the trace depends on the condition of signal 24 in the sample period just following the trigger 26. As multiple triggers 26 are received by the oscilloscope and corresponding portions of signal 24 are traced across the display 22, the resulting eye pattern 20 is obtained.

Several portions of the eye pattern 20 are of significance in characterizing signal 24. The vertical position of high state 34 and low state 36 correspond to the amplitudes of these states. Once values for states 34 and 36 are obtained, several further points of interest may be derived. For example, a first distal point 48 lies along transition path 40 at approximately 80 percent of the potential of state 34 relative to state 36. A second distal point 50 lies along transition path 42 at approximately 80 percent of the potential of state 34 relative to state 36. A first proximal point 52 lies along transition path 42 at approximately 20 percent of the potential of state 34 relative to state 36. A second proximal point 54 lies along transition path 40 at approximately 20 percent of the potential of state 34 relative to state 36. A first mesial point 56 lies at 50 percent of the potential of state 34 relative to state 36, and is generally at the intersection, or cross-over point, of transition paths 40 and 42.

A second mesial point 58 also lies at approximately 50 percent of the potential of state 34 relative to state 36, and at the cross-over point of paths 44 and 46. The mesial points 56 and 58 may not lie at the cross-over points of paths 40 and 42 and paths 44 and 46, respectively.

To characterize signal 24 by way of eye pattern 20, once values for states 34 and 36 are established and the corresponding points 48-58 are identified, a set of known calculations are performed to derive certain characteristics of signal 24. In previous methods of using an eye pattern for such purposes, the position of states 34 and 36 were found by observation of eye pattern 20 on an oscilloscope screen and manually marking the points 48-58 on the oscilloscope screen 22. Once these points of eye pattern 20 were manually measured on the oscilloscope screen 22, the observer would manually calculate the desired signal characteristics using this manually derived data. In accordance with the present invention, however, such data may be collected automatically and the calculations performed automatically without requiring manual computation by the observer.

Figure 3:
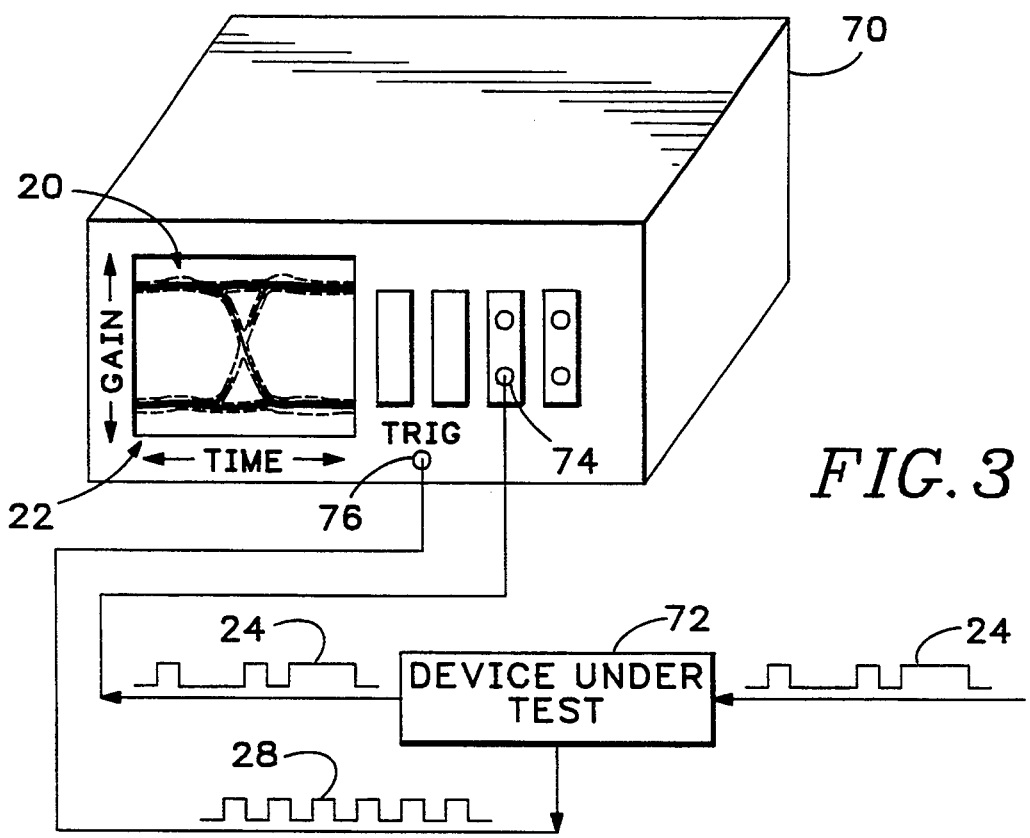
Figure 5:
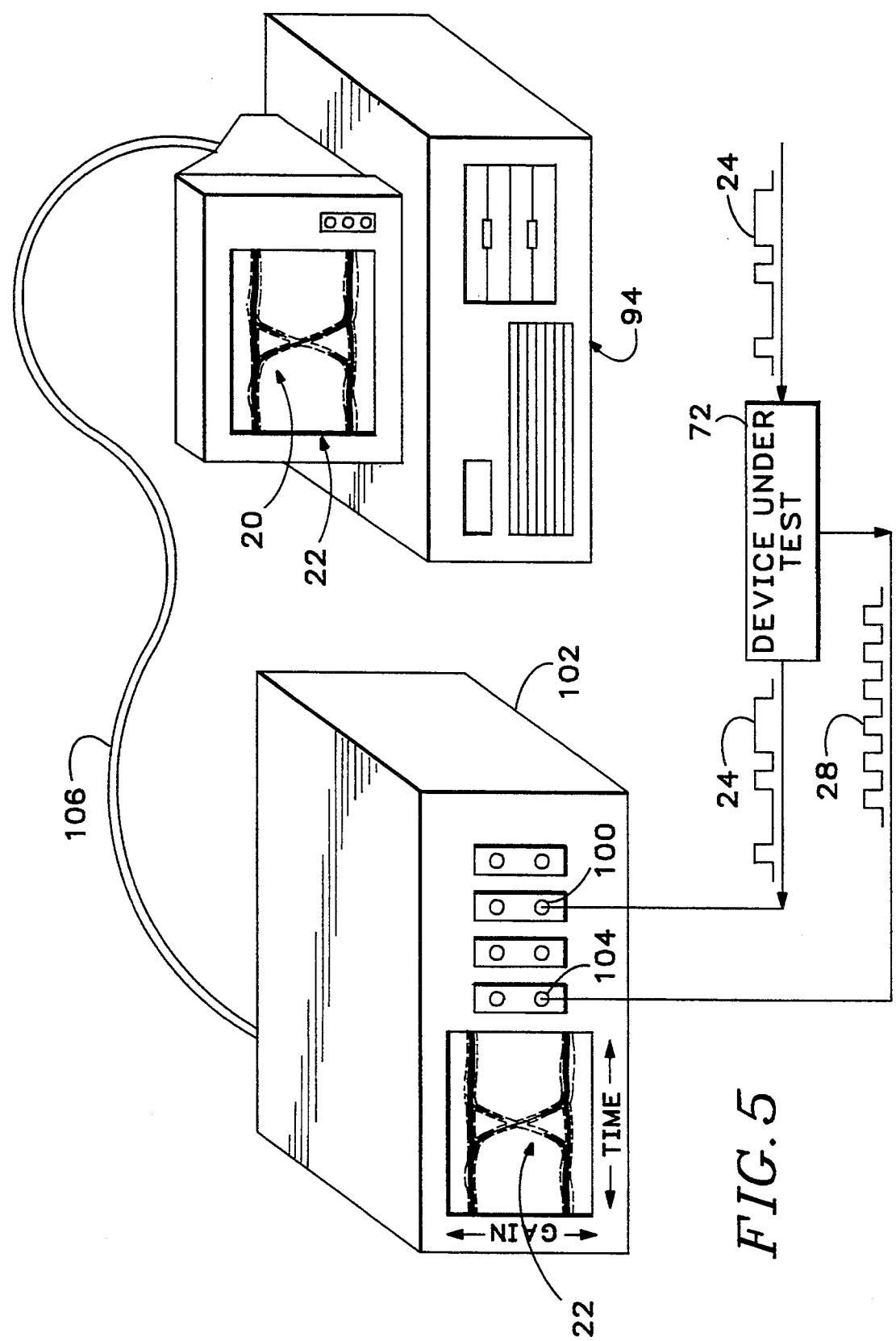

FIGS. 3–5 illustrate several examples of hardware configurations suitable for use in accordance with the present invention. In each case, communication signal 24 is received and an eye pattern 20 is generated and analyzed in order to characterize the communication signal. The process is accomplished automatically without the risk of human error or labor cost.

In FIG. 3, a communication signal analyzer 70 produces an eye pattern 20 on a screen 22 in response to a trigger or conversion clock signal 28 and the communication signal 24. More particularly, the communication signal 24 is applied to a device 72 under test. The function of device 72 is to replicate the signal 24, and this replicated signal 24 is applied to signal analyzer 70 to determine the quality of the replicated signal 24. Device 72 also analyzes the signal 24 and generates a recovered conversion clock signal 28 used to trigger analyzer 70. Alternatively, the signal 24 itself may be used as a trigger source in place of clock signal 28. Communication signal analyzer 70 is a programmable device including processor and memory elements for manipulating and storing data relative to signals presented on display 22. More particularly, display 22 includes an array of pixels for image display. For each trace of a portion 30 of signal 24, a corresponding set of such pixels are illuminated.

The communication signal analyzer 70 monitors each display trace and maintains a database corresponding to the pixel array of display 22. Because the display progresses from left to right in increments one pixel at a time, each trace of signal 24 across display 22 may be represented by an ordered sequence of data hits corresponding to the path of pixels illuminated on each display trace pass. As will be described in greater detail hereafter, communication signal analyzer 70 maintains, in accordance with the present invention, an eye pattern database which accumulates such data hits for a given number of traces of signal 24.

FIG. 4 illustrates a second hardware configuration example. In FIG. 4, the device 72 under test receives the communication signal 24 and produces the replicated signal 24 and the recovered clock signal 28, as described in connection with FIG. 3. The replicated communication signal 24 is applied to an input channel 80 of an analog oscilloscope 82. The clock signal 28 is applied to an external trigger input 84 of oscilloscope 82. Thus, when triggering on external trigger input 84 and displaying the signal 24 as taken from input channel 80, an eye pattern (not shown) is produced on the display screen 86 of oscilloscope 82.

A digitizing camera system 88 is positioned in front of the oscilloscope screen 86 for capturing the image of the eye pattern. More particularly, a CCD camera 90 is positioned to capture the image of screen 86 as a grey scaled image. The grey scaled image is then transferred by way of video cable 92 to a controller card (not shown) of a computer 94. As will be described in greater detail hereafter, the grey scaled image, as taken from the CCD camera 90, is used to build a database representing the eye pattern 20, which may be displayed on the display 22 of computer 94.

FIG. 5 illustrates a third hardware configuration. The device 72 again produces the recovered clock signal 28 and the replicated communication signal 24, as previously described. The replicated communication signal 24 is applied to an input 100 of a digitizer 102 while the clock signal 28 is applied to a trigger input 104 thereof. The digitizer 102 may be connected, e.g., by RS-232 communication link 106, to a controller card (not shown) of computer 94, whereby a digitized form of the eye pattern 20 may be provided on display 22 of computer 94.

It will be appreciated that in each of the hardware configurations shown in FIGS. 3–5, it is possible to monitor a communication signal, generate an eye pattern corresponding to the communication signal, digitize the eye pattern, and generate a database corresponding to the digitized eye pattern.

Figure 6:
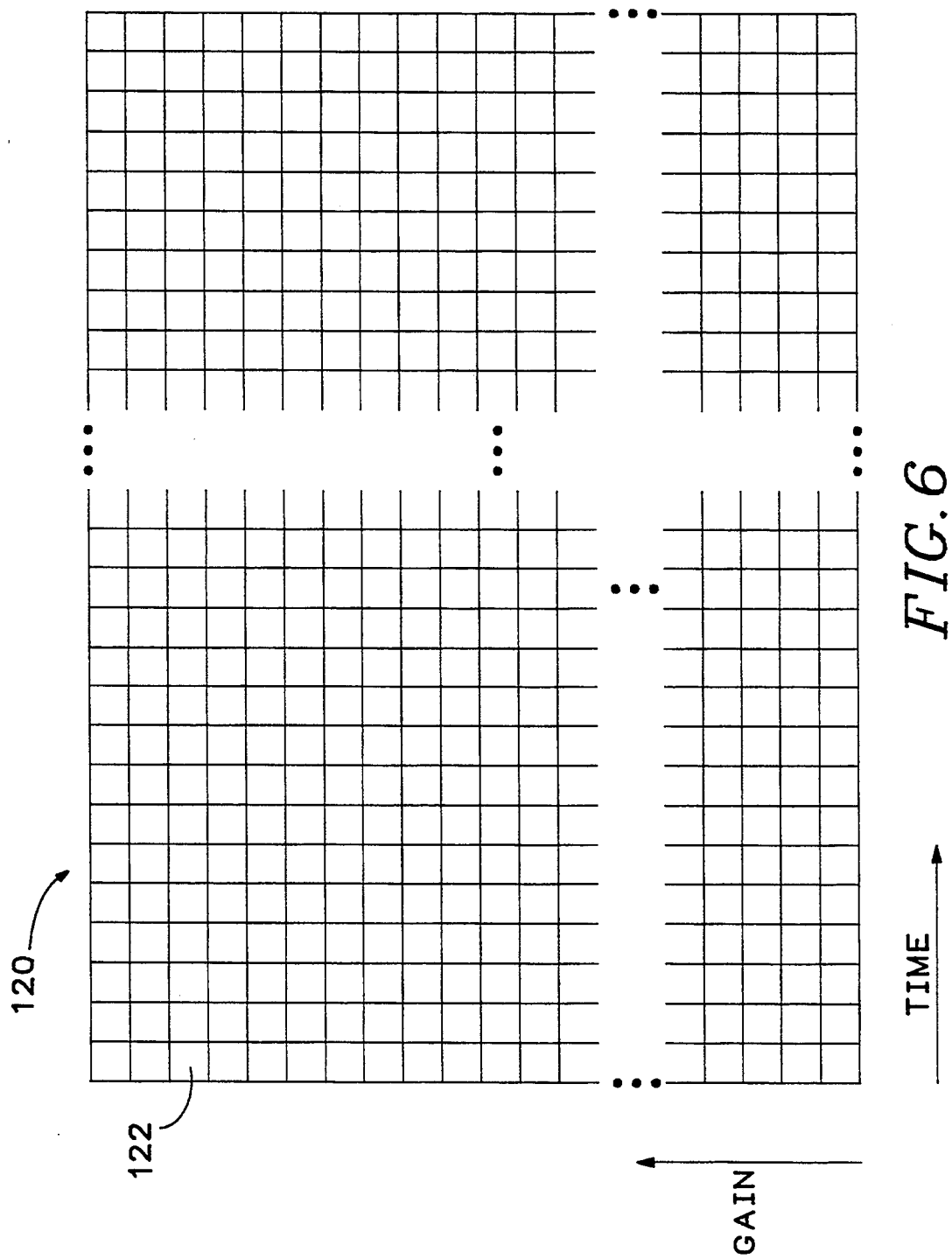
FIGS. 6–7 illustrate an eye pattern database structure for representation of a digitized eye pattern.

FIG. 6 illustrates a database suitable for storing the digitized eye pattern 20. The database includes a two-dimensional accumulator array 120 having individual accumulator cells 122 corresponding to each data point or pixel of a display 22. The rows in array 120 correspond to different amplitudes, or gains, of the signal 24 while the columns correspond to time during individual sample periods. Thus, a gain address value in combination with a time address value specify one of the accumulator cells 122 in array 120. Each accumulator cell 122 of array 120 thereby corresponds to a pixel of display 22. For a given trace across display 22, the accumulator cells 122 corresponding to pixel elements illuminated during that trace are incremented to account for the trace. As multiple traces are applied to the display 22, and the corresponding accumulator elements 122 are incremented, a database representing the eye pattern is obtained.

Figure 7:
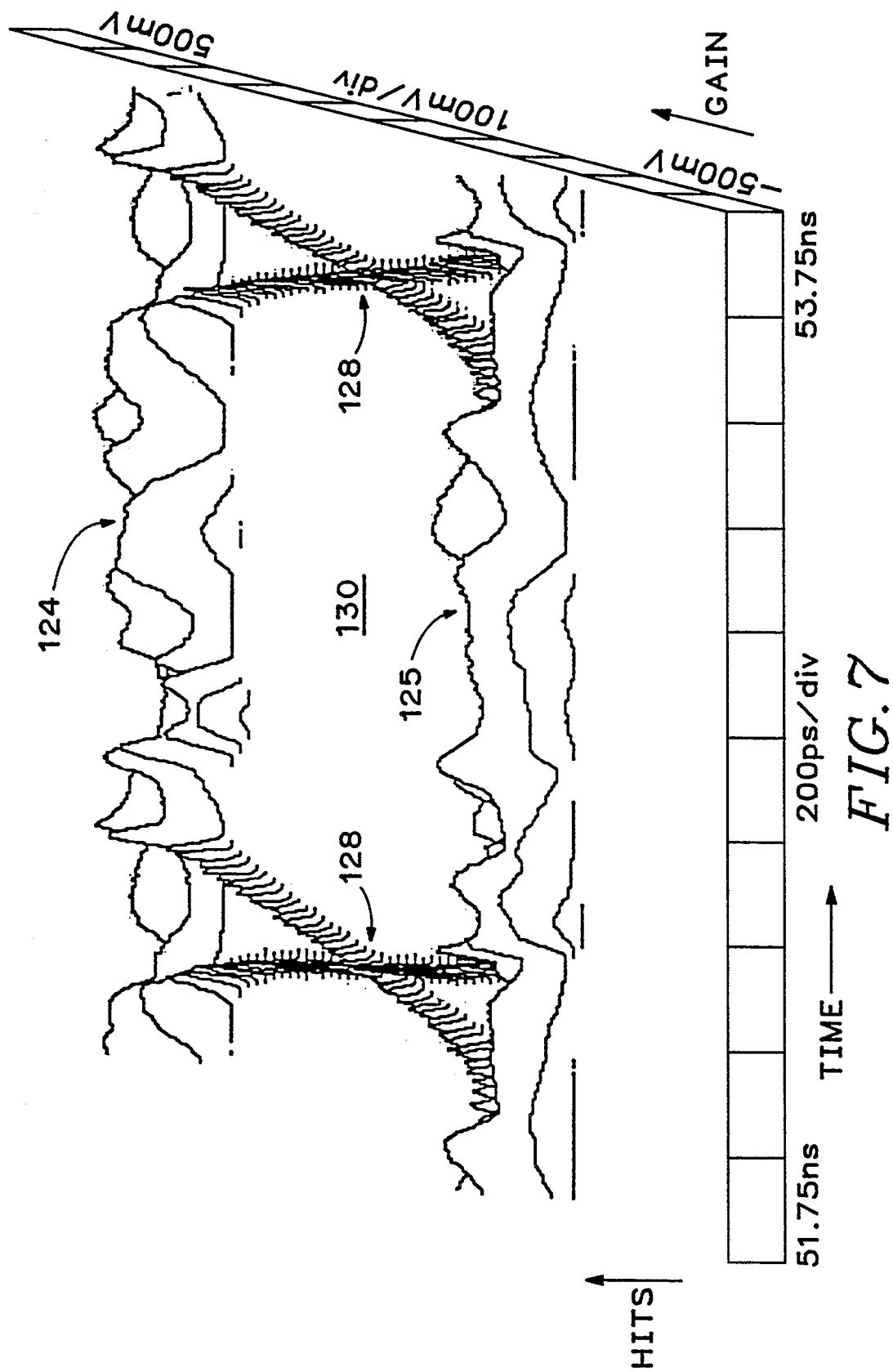

FIG. 7 illustrates a three-dimensional view of the array 120 in a state representing an eye pattern 20. In FIG. 7, the substantially horizontal dimensions of TIME and GAIN correspond to the time and gain address fields of array 120, while the substantially vertical dimension HITS represents the value held in each accumulator cell 122. By first initializing all accumulator cells 122 to zero and then applying multiple digitized traces of a communication signal 24 to the array 120, an eye pattern may be displayed. As seen in FIG. 7, the high and low states 34 and 36, respectively, are represented as ridges 124 and 125, respectively, extending from left to right. Transition paths 40–46 are similarly represented as crossing ridges 128 which interconnect the ridges 124 and 125 in a manner similar to that shown for paths 40–46, interconnecting states 34 and 36 in FIG. 2. A valley region 130 bounded above and below by the ridges 124 and 125, respectively, and on the left and right sides by crossing ridges 128 corresponds to the eye 38 (FIG. 1).

Figure 9:
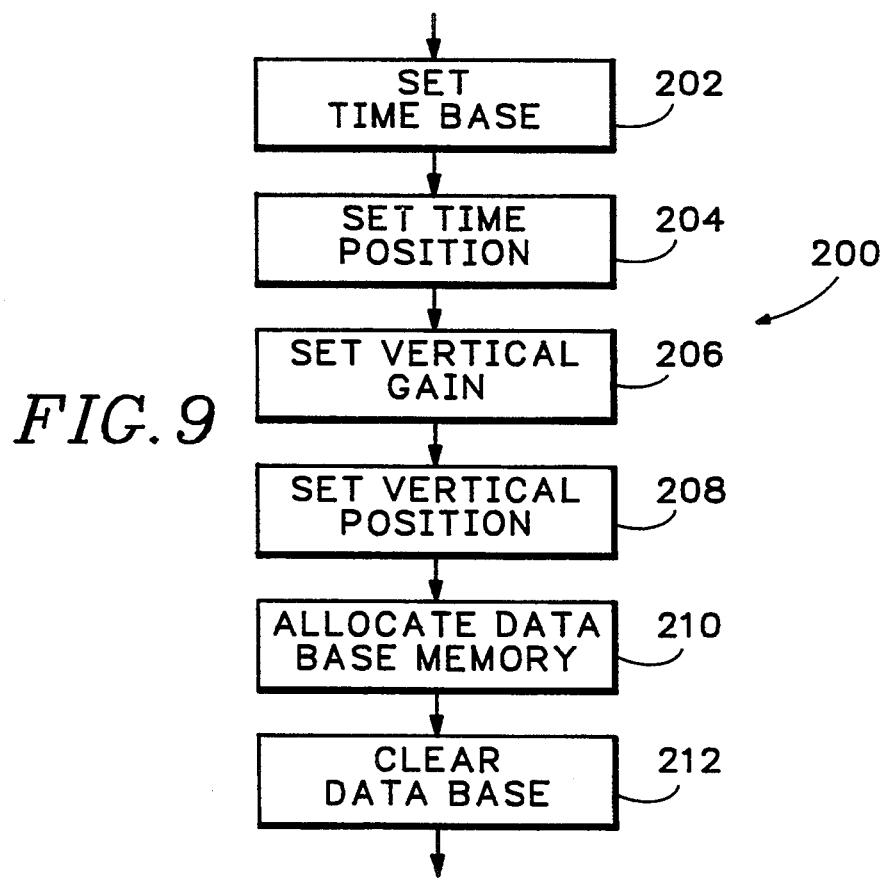
Figure 8:
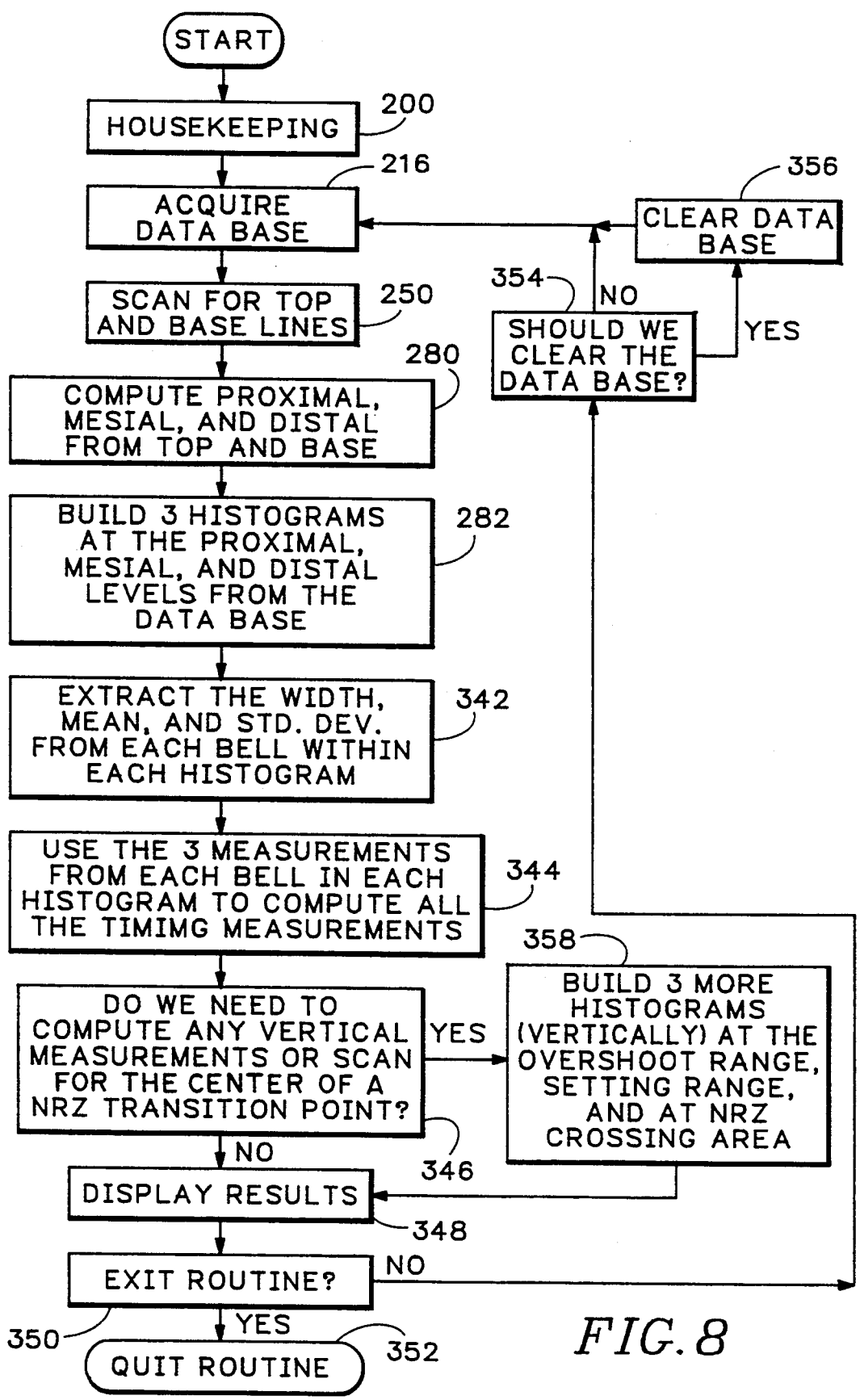

FIG. 8 is a flow chart illustrating a method, in accordance with the present invention, for characterizing communication signal 24. In FIG. 8, processing begins in housekeeping block 200 where, as further illustrated in FIG. 9, system parameters are established. In blocks 202 and 204, time related parameters, such as time base and time position, respectively, are provided. Similar gain related parameters, i.e., vertical gain and vertical position, are specified in blocks 206 and 208, respectively. These time and gain parameters establish the necessary settings for the display device to properly present an eye pattern. In block 210, sufficient memory is allocated as a database for storing an eye pattern representation.

Returning to FIG. 8, processing then continues to data acquisition block 216 where a communication signal is applied to a device, e.g., one of the hardware configurations shown in FIGS. 3–5, for collecting display data relative to each display trace of signal 24. For each trigger 26 (FIG. 1), a corresponding portion 30 (FIG. 1) of signal 24 is sampled and incorporated into the eye pattern database. By applying a sufficient number of such traces to the eye pattern database, the database reflects the nature of the eye pattern associated with signal 24.

FIG. 10 illustrates data acquisition from each of the hardware configurations shown in FIGS. 3–5. However, it will be understood that the present invention may be practiced on many hardware configurations, and those illustrated and described herein are for the purpose of illustration. In FIG. 10, processing begins in block 218, where the type of data acquisition device is determined. Processing branches to one of blocks 220, 222 or 224, depending on whether the configuration of FIG. 4, 5 or 3, respectively, is being used.

For the configuration of FIG. 4 using analog oscilloscope 82 and CCD camera 90, processing continues from block 220 to block 226, where computer 94 communicates by way of link 92 with CCD camera 90 to initialize camera 90. It is assumed, at this time, that oscilloscope 82 is running with signals 24 and 28 driving inputs 80 and 84, respectively, and an eye pattern is present on screen 86. Computer 94 then commands, in block 228, CCD camera 90 to open its lens for a given exposure time. During this exposure time, camera 90 captures the image of the eye pattern then present on screen 86.

The grey scaled eye pattern image available from CCD camera 90 is transferred to the accumulator array 120 (FIG. 6) in block 230. For each grey scaled pixel taken from CCD camera 90, a corresponding accumulator cell 122 is reserved. The grey scale intensity value for each CCD pixel is converted to a number of hits value as follows. The intensity of each portion of screen 86 is proportional to the number of signal traces passing through it, and this information is reflected in the grey scaling of the corresponding portion of the eye pattern image taken from camera 90. Thus, for relatively high intensity portions of screen 86, as reflected in the CCD eye pattern image, the corresponding accumulator cells 122 hold a relatively high number of hits value. Similarly, for relatively low intensity portions of screen 86, the corresponding accumulator cells 122 hold a relatively low number of hits value. In each case, the number of hits value corresponds to the number of signal 24 display traces passing through the associated portion of display 86.

For the configuration of FIG. 5, processing branches from block 218 of FIG. 10 to block 222 to acquire eye pattern data from a real time, equivalent time or sampling digitizer, as represented by the device 102. For each trigger 26 applied to device 102, a sequence of numbers corresponding to signal 24 amplitudes at discrete points during the corresponding sample period are obtained. The position of each amplitude value in the sequence corresponds to the time or horizontal base of device 102. Thus, the amplitude value sequence, referred to as a curve in FIG. 10, represents one trace across the display 22 of device 102. Processing continues from block 222 to block 232, where computer 94 waits for device 102 to provide a curve, i.e., a sequence of amplitude values. The curve data is taken from device 102 and then applied, in block 236, to the eye pattern database. The position of each amplitude value in the sequence corresponds to the time address field of array 120, while the numeric value of each amplitude value corresponds to the gain address field. Thus, for each value taken from the amplitude value sequence, a corresponding accumulator cell 122 may be addressed. To apply the sequence of amplitude values to the array 120, each corresponding addressed accumulator cell 122 is incremented by one.

Following a sufficient number of triggers 26, the array 120 acquires data from many display traces and thereby collects within the eye pattern database a representation of the eye pattern associated with signal 24. In block 238, the number of curves incorporated into array 120 is tested against a given total desired number of traces, i.e., a number sufficient to adequately represent an eye pattern. If a sufficient number of curves have not yet been received, processing then returns to block 232 where computer 94 waits for device 102 to deliver the next curve for incorporation into the eye pattern database. When sufficient number of curves have been incorporated into the eye pattern database, processing branches from block 238 and continues to block 250 of FIG. 8.

For the configuration of FIG. 3, processing branches from block 218 to block 224 to acquire eye pattern data from the communication signal analyzer 70. The communication signal analyzer 70 includes means for digitizing the signal 24 in response to each trigger 26, as provided by clock signal 28. For each display trace on display 22, communication signal analyzer 70 provides a sequence of data points corresponding to the portion 30 (FIG. 1) of signal 24 displayed following the trigger 26. More particularly, the sequence of data points correspond to pixels of display 22 illuminated during the display trace. The points are ordered according to the time axis and, therefore, are similar to the curve data described in connection with the device of FIG. 5. Thus, for each display trace provided by analyzer 70, an ordered sequence of amplitude values are obtained. This sequence of amplitude values address the accumulator array 120 by using the position of the amplitude value as the time address field and the magnitude of the amplitude value as the gain address field. The cells 122 addressed by a given amplitude value sequence are each incremented. Processing such amplitude value sequences continues in block 240 for a given time until a sufficient number of such amplitude value sequences have been applied to the accumulator array 120.

Returning to FIG. 8, it may, therefore, be appreciated how in block 216 the array 120 acquires values representing an eye pattern as depicted in FIG. 7. Each cell 122 of array 120 contains a number of hits value corresponding to the number of display traces passing through a given portion of display 22. After incorporating a sufficient number of such display traces into accumulator array 120, an eye pattern database develops which may be used to characterize the eye pattern of signal 24. The eye pattern database, therefore, contains a statistical image of the eye pattern appearing on display 22 with regions of high hit values corresponding to the ridges 124, 125 and 128 (FIG. 7), and low or zero hit values corresponding to, for example, the valley 130 (FIG. 7).

Having acquired an eye pattern representation in the array 120, processing continues to block 250 where the amplitude values for high and low states 34 and 36, respectively, are determined. It should be understood that the amplitude values of the states 34 and 36 can float within a range of discrepancy due to transmission related effects. But, to distinguish between the states 34 and 36, i.e., to obtain the information carried by signal 24, it is necessary to know the values of states 34 and 36. In accordance with the present invention, such determination of the values for states 34 and 36 may be automated by use of the eye pattern database held in array 120.

Figure 11:
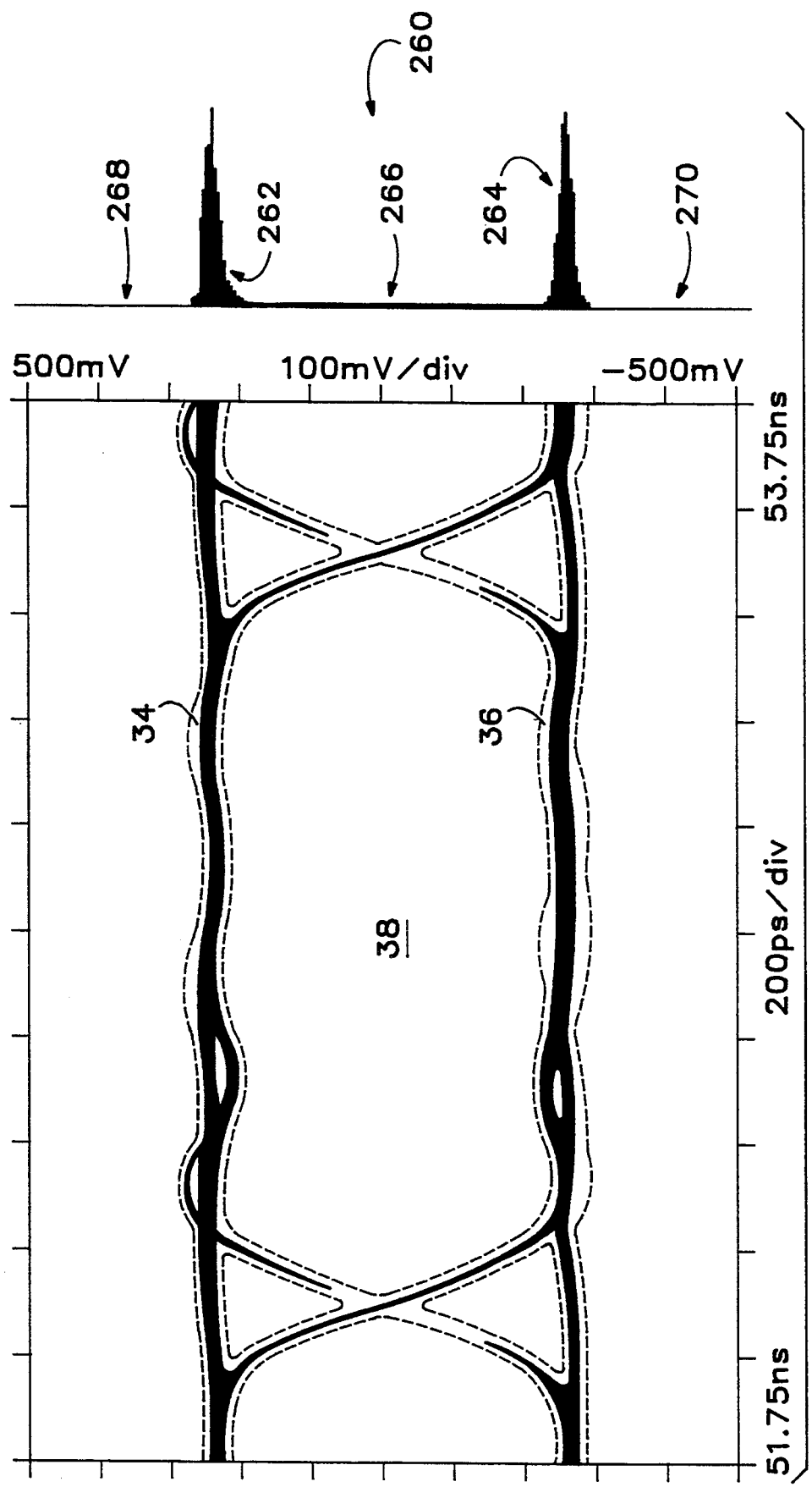
FIGS. 11–18 illustrate eye patterns and corresponding histograms obtained for the purpose of characterizing the digital communication signal.

With reference to FIGS. 6 and 11, selected portions of the accumulator array 120 are summed to obtain values for states 34 and 36. More particularly, the values in each row of accumulator cells 122, i.e., for a set of cells 122 having the same gain address value, are summed. Histograms based on such summation values are then constructed to derive the amplitude values for states 34 and 36. As shown in FIG. 11, such a histogram 260 is obtained relative to the eye pattern 22. Two substantially bell-shaped structures 262 and 264 of histogram 260 are apparent and indicate the values of states 34 and 36. An area 266 between bell-shaped structures 262 and 264 having relatively smaller values indicates a region of signal 24 amplitudes having relatively fewer data hits. Also, the area 268 above bell-shaped structure 260 and the area 270 below bell-shaped structure 262, having virtually all zero hit values, indicate regions of signal 24 amplitude not traversed by signal 24, i.e., amplitude regions where the display trace does not pass.

It will be understood that inspecting the histogram 260 to locate the bell-shaped structures 262 and 264 may be accomplished by many methods. For example, the histogram 260 may be stored in a one-dimensional array of values with each value corresponding to a given gain address, i.e., to a given absolute amplitude of signal 24. By passing through such a one-dimensional array and monitoring peak values and peak value positions, the center points of bell-shaped structures 262 and 264 may be obtained. Once the bell-shaped structures 260 and 262 are located, the values for states 34 and 36 may be set.

Returning to FIG. 8, the top and base lines, i.e., the values for states 34 and 36 are thereby obtained in block 250. In the next processing block 280, the proximal, mesial and distal gain values of the signal 24 are determined by reference to the values for states 34 and 36. More particularly, given the values for states 34 and 36, the amplitude of state 34 relative to state 36 is known. The gain values at 20 percent, 50 percent, and 80 percent of the amplitude of state 34 relative to state 36, therefore, may be obtained. It will be understood, however, that any given percentage may be used. Processing then continues to block 282 where timing histograms are constructed for determining the time axis or horizontal position of the proximal, mesial and distal points of eye pattern 20.

Figure 12:
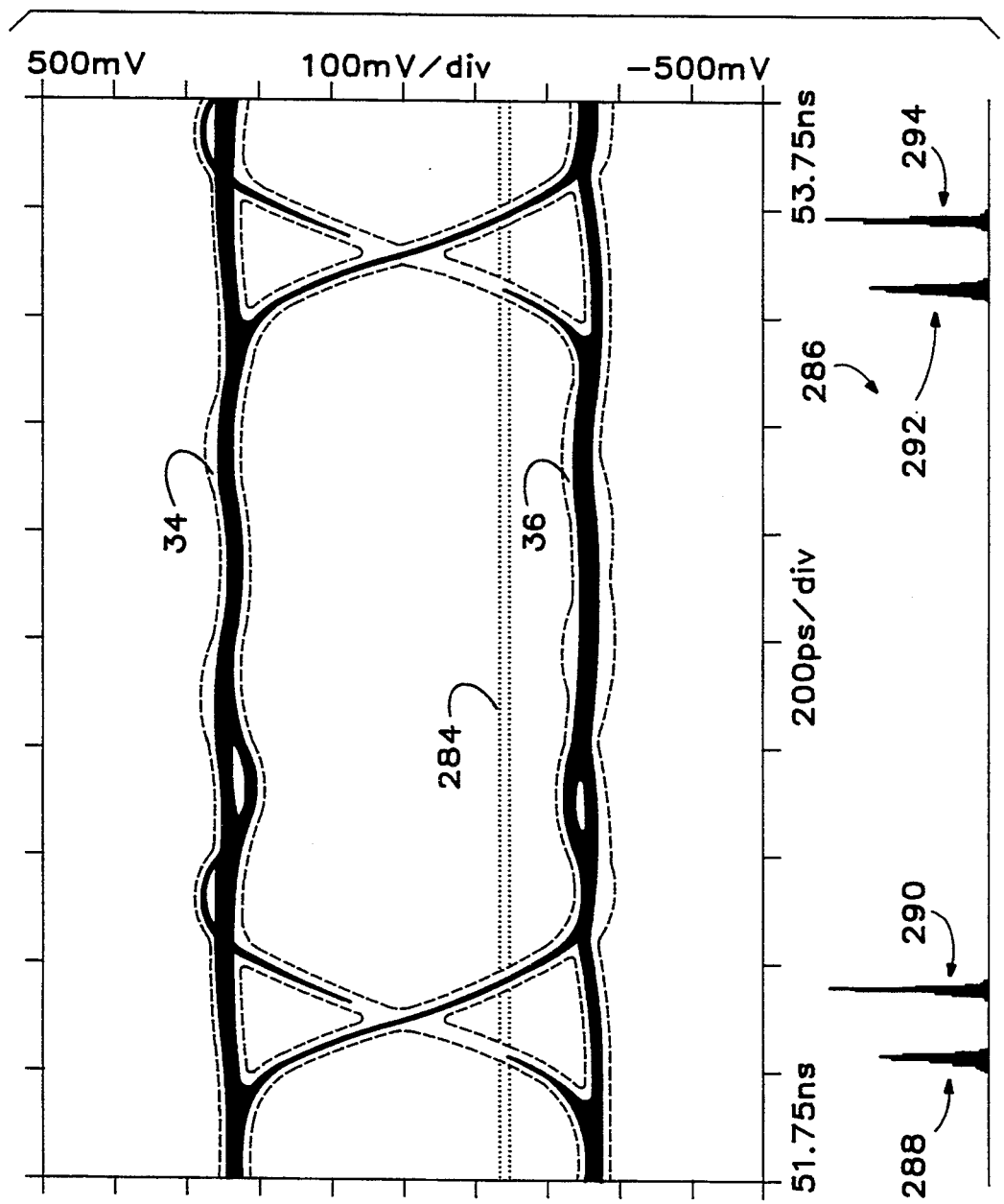

FIG. 12 illustrates the block 282 (FIG. 8) method of obtaining the first and second proximal points 52 and 54 (FIG. 2), respectively. Given the absolute values for states 34 and 36 as previously described, an accumulator band 284 is established relative to states 34 and 36. The accumulator band 284 is a group of adjacent accumulator cell 122 rows corresponding to a range of signal 24 values. Band 284 may, therefore, correspond to any desired range of gain values. The band 284 can be as few as one row of cells or up to seven or more rows, as needed. Band 284 is centered relative to the gain value calculated in block 280 as a percentage of the amplitude of state 34 relative to that of state 36. As shown in FIG. 12, band 284 is centered at a gain corresponding to 20 percent of the amplitude of state 34 relative to state 36.

A histogram 286 is then obtained by summing selected ones of the accumulator cells 122 of band 284. More particularly, for each vertical column of cells 122 in band 284, those having common time address fields, the number of hits values are summed. As shown in FIG. 12, four substantially bell-shaped structures 288, 290, 292 and 294 are found in histogram 286. Again, it will be understood that many methods for inspecting histogram 286 for the position and shape of structures 288, 290, 292 and 294 should be apparent.

The first bell-shaped structure 288 corresponds to the position of the first proximal point 52 (FIG. 2). The center line of structure 288 provides the time position of point 52 relative to, e.g., the clock 28. The amplitude position of point 52 is known from block 280. The time position and gain position fully specify the position of point 52. The second proximal point 54 is obtained in a similar manner by reference to bell-shaped structure 290. The bell-shaped structures 292 and 294 correspond to similar proximal points on the other side of the eye 38, but which may not be essential to characterization of signal 24.

Figure 13:
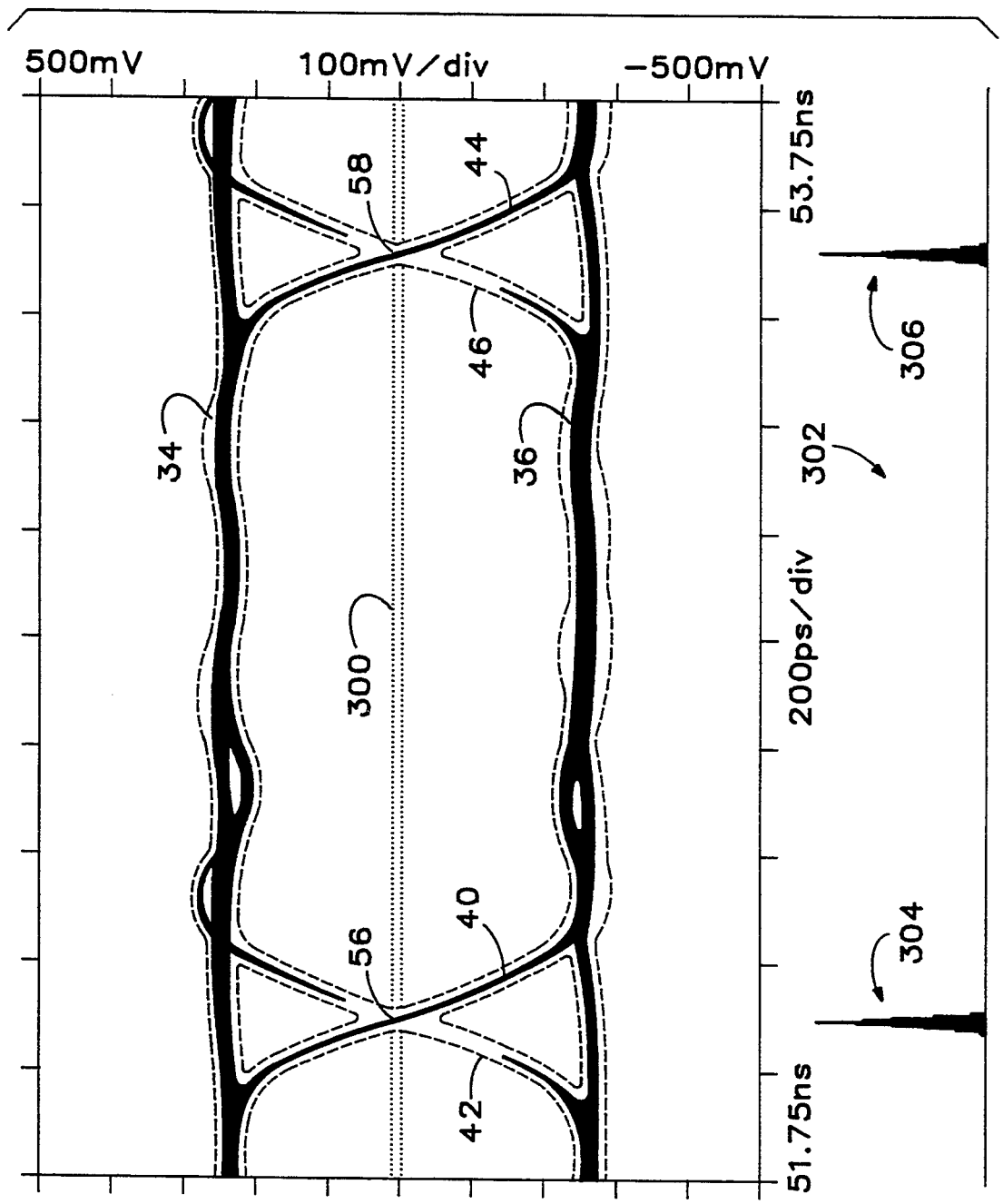

FIG. 13 illustrates the block 282 (FIG. 8) method of obtaining the first and second mesial points 56 and 58, respectively. A band 300, of a selected gain or amplitude range, is positioned between states 34 and 36 as calculated in block 280. Band 300 is centered around 50 percent of the amplitude of state 34 relative to state 36. A histogram 302 is generated by summing accumulator cells of band 30 having common time address values, i.e., vertical columns within band 300. Histogram 302 yields a first bell-shaped structure 304 corresponding to the first mesial point 56, and a second bell-shaped structure 306 corresponding to the second mesial point 58.

Because the cross-over points of transition paths 40 and 42 and of paths 44 and 46 are substantially at 50 percent of the amplitude of state 34 relative to state 36, as illustrated in FIG. 13, band 300 passes through such cross-over points and only two bell-shaped structures emerge. However, if additional bell-shaped structures are found in histogram 302, it is known that such cross-over points are not at 50 percent of the amplitude of state 34 relative to state 36. In the event that histogram 302 includes more than two bell-shaped structures, the cross-over points for paths 40 and 42 and of paths 44 and 46 may be determined, as described more fully hereafter, by further summing of selected portions of array 120.

Figure 14:
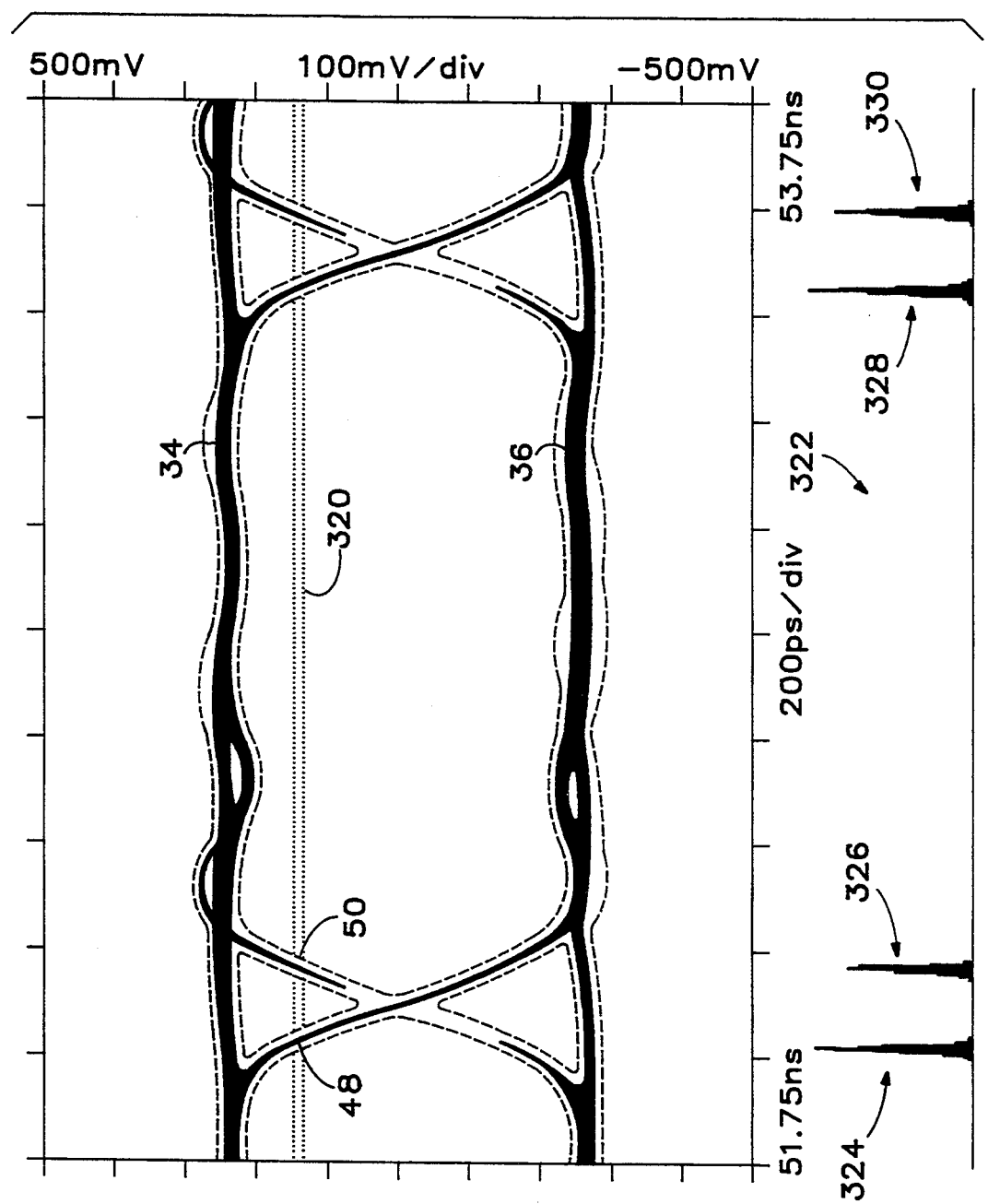

FIG. 14 illustrates the block 282 (FIG. 8) method of obtaining the first and second distal points 48 and 50, respectively. An accumulator band 320, similar to bands 300 and 284 previously described, is centered, in accordance with the calculations of block 280, at a gain corresponding to 80 percent of the amplitude of state 34 relative to state 36. A histogram 322 is then obtained by summing selected ones of the accumulator cells 122 of band 320. More particularly, for each vertical column of cells 122 in band 320, those having common time address fields, the number of hits values are summed. Four substantially bell-shaped structures 324, 326, 328, 330 emerge. Inspection of histogram 322 reveals the position of bell-shaped structures 324, 326, 328, and 330 relative to clock 28. Accordingly, bell-shaped structure 324 corresponds to the first distal point 48 and bell-shaped structure 326 corresponds to the second distal point 50.

Returning to FIG. 8, the above noted block 282 methods of constructing histograms relative to the proximal, mesial and distal points of eye pattern 20 result in a collection of bell-shaped histogram structures. Each such bell-shaped structure can be stored as a vector of numbers, each such stored number corresponding to a summation of selected cell 122 values. Processing then continues to block 342 where each bell-shaped structure is further analyzed to extract the width, mean and standard deviation thereof. Given the width, mean and standard deviation of each bell-shaped structure, processing advances to block 344 where timing measurements for each bell-shaped structure are computed.

Determining the values for states 34 and 36, the positions of the proximal, mesial and distal points, and further timing measurements relative to the eye pattern 20 comprise the basic analysis performed by the algorithm of FIG. 8. Additional measurements may be optionally accomplished as determined at branch block 346. If such additional measurements are not desired, processing branches at block 346 to block 348 where the measurement results and calculations of signal characteristics relative to eye pattern 20 are displayed. If additional processing, e.g., analysis of a second eye pattern, is not desired, processing branches at block 350 to exit block 352. Otherwise, the eye pattern database may be optionally cleared in block 354. If the database is to be cleared, processing proceeds through block 356 to data acquisition block 216, otherwise, processing branches directly from block 354 to data acquisition block 216. Upon reaching data acquisition block 216, additional eye pattern data is applied to array 120 and processing continues as previously described.

If it is determined, in block 346, that additional measurements beyond the basic timing analysis are required, then processing branches at block 346 to block 358. In block 358, several additional measurements are performed. First, processing in block 358 analyzes the overshoot, undershoot and settling characteristics of signal 24. Additionally, the cross-over points between transition paths 40 and 42 and between 44 and 46 are identified.

Figure 15:
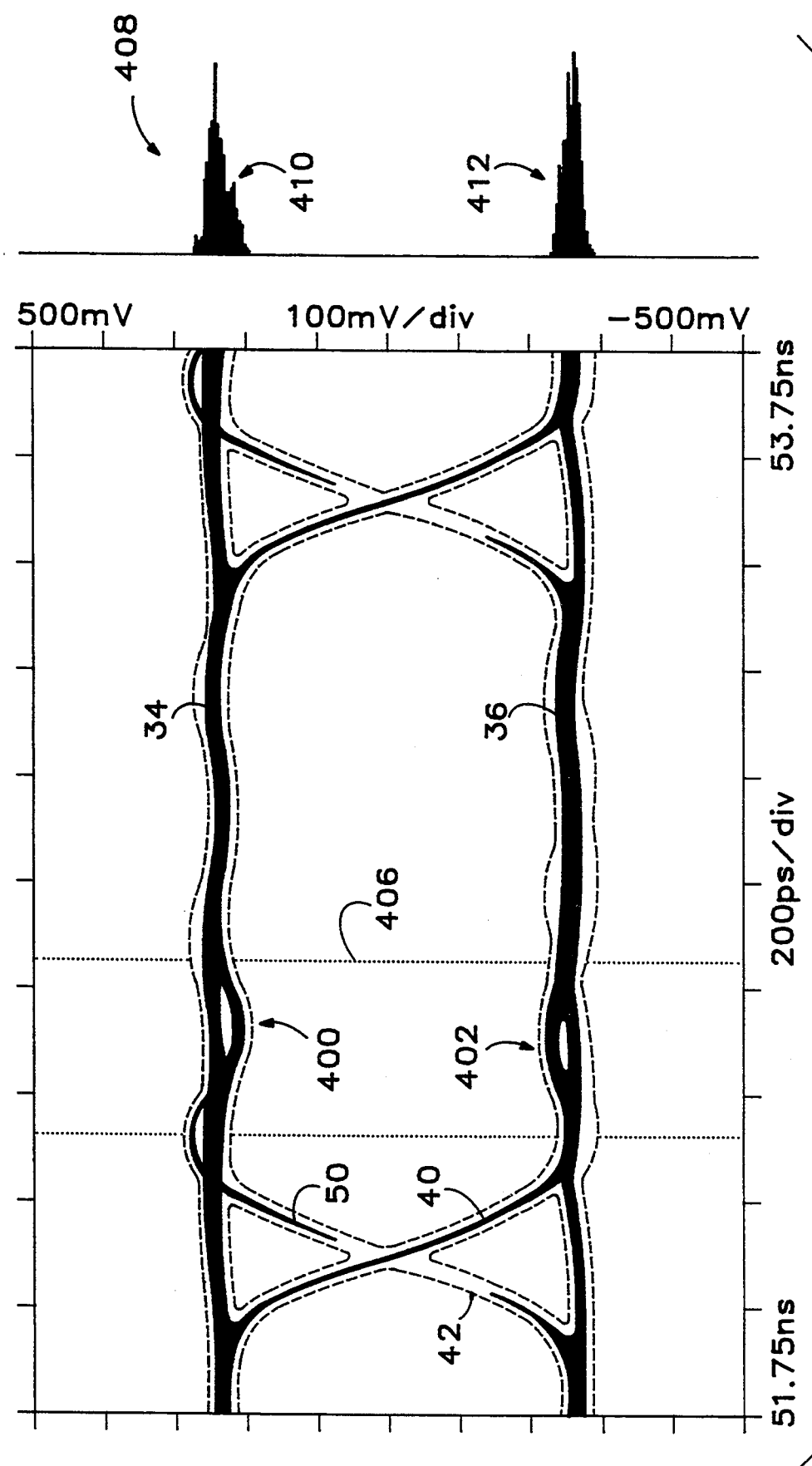

FIG. 15 illustrates the block 358 method of characterizing signal 24 overshoot and undershoot. In FIG. 15, overshoot occurs when a signal 24 trace following transition path 42 goes above state 34 in an overshoot region 400. A similar condition exists in undershoot region 402 where a signal 24 trace following transition path 40 goes below state 36. In each case, the signal 24 exhibits a sinusoidal ringing behavior, the first portion of which is termed overshoot and undershoot. A vertical band 406 of cells 122 encompasses the full range of gain address values for array 120, but a selected range of time address values corresponding to the overshoot and undershoot regions 400 and 402, respectively. Band 406 may be positioned relative to, for example, proximal and distal points 40 and 50, respectively. By summing selected ones of the cells 122 of band 406, the overshoot and undershoot characteristics of eye pattern 20 are determined. More particularly, by summing each row, i.e., cells 122 having common gain address values, a histogram 408 is obtained. The histogram 408 will include two bell-shaped structures 410 and 412. The bell-shaped structure 410 corresponds to the overshoot of transition path 50 and the bell-shaped structure 412 corresponds to the undershoot of transition path 40. By examining the width of bell-shaped structures 410 and 412, the overshoot and undershoot characteristics of signal 24 are determined.

Figure 16:
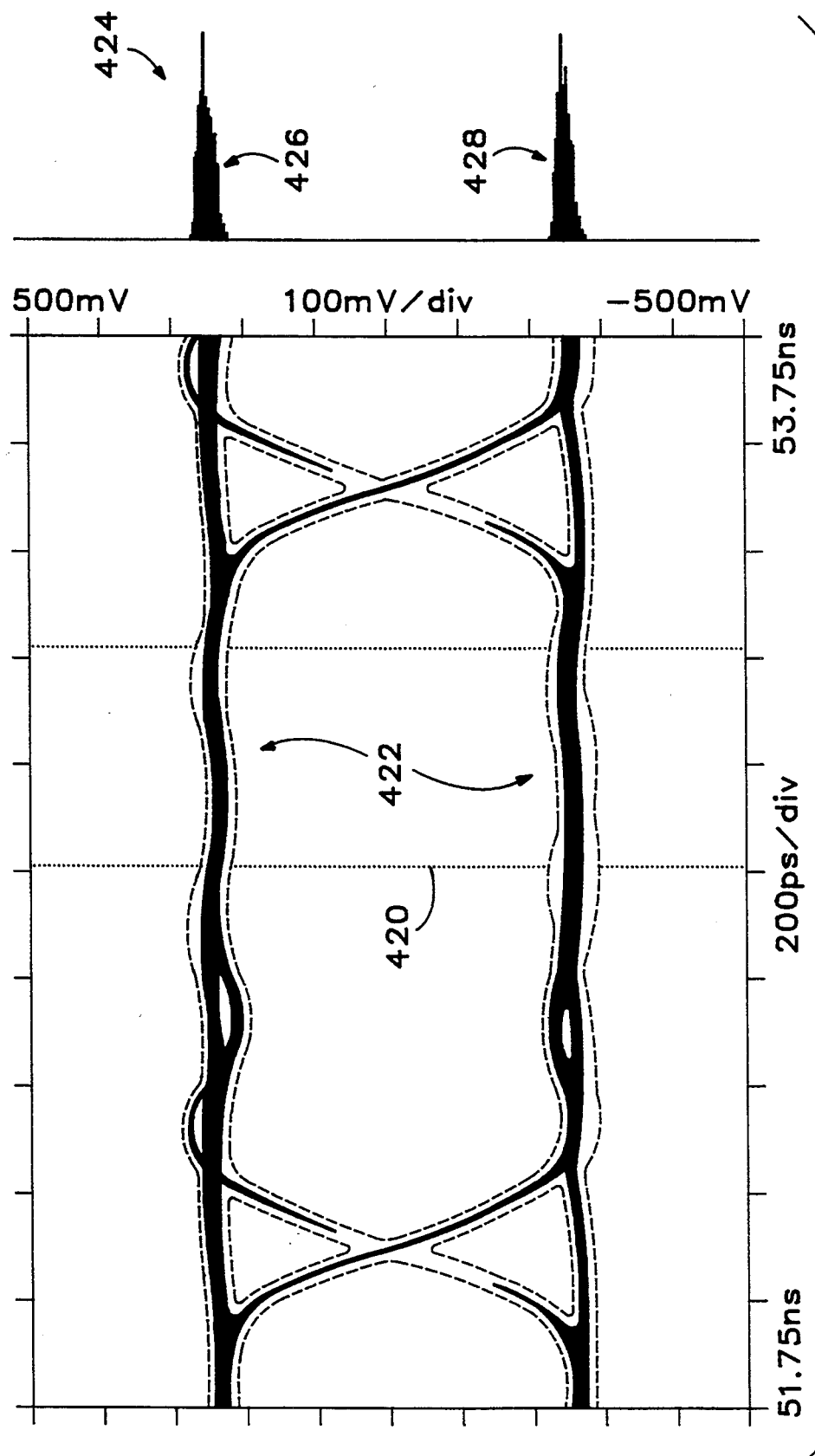

FIG. 16 illustrates a similar block 358 method of characterizing the settling or ringing portion of signal 24. A vertical band 420, similar to band 408, is positioned in a ringing region 422 just following the overshoot and undershoot regions 400 and 402. Histogram 424 is constructed by summing rows of accumulators 122 within band 420, i.e, accumulators having common gain address fields. Histogram 424 includes two bell-shaped structures 426 and 428 which correspond to ringing at states 34 and 36, respectively, of signal 24 in the region 422. The width of bell-shaped structures 426 and 428 generally characterize such ringing.

Figure 17:
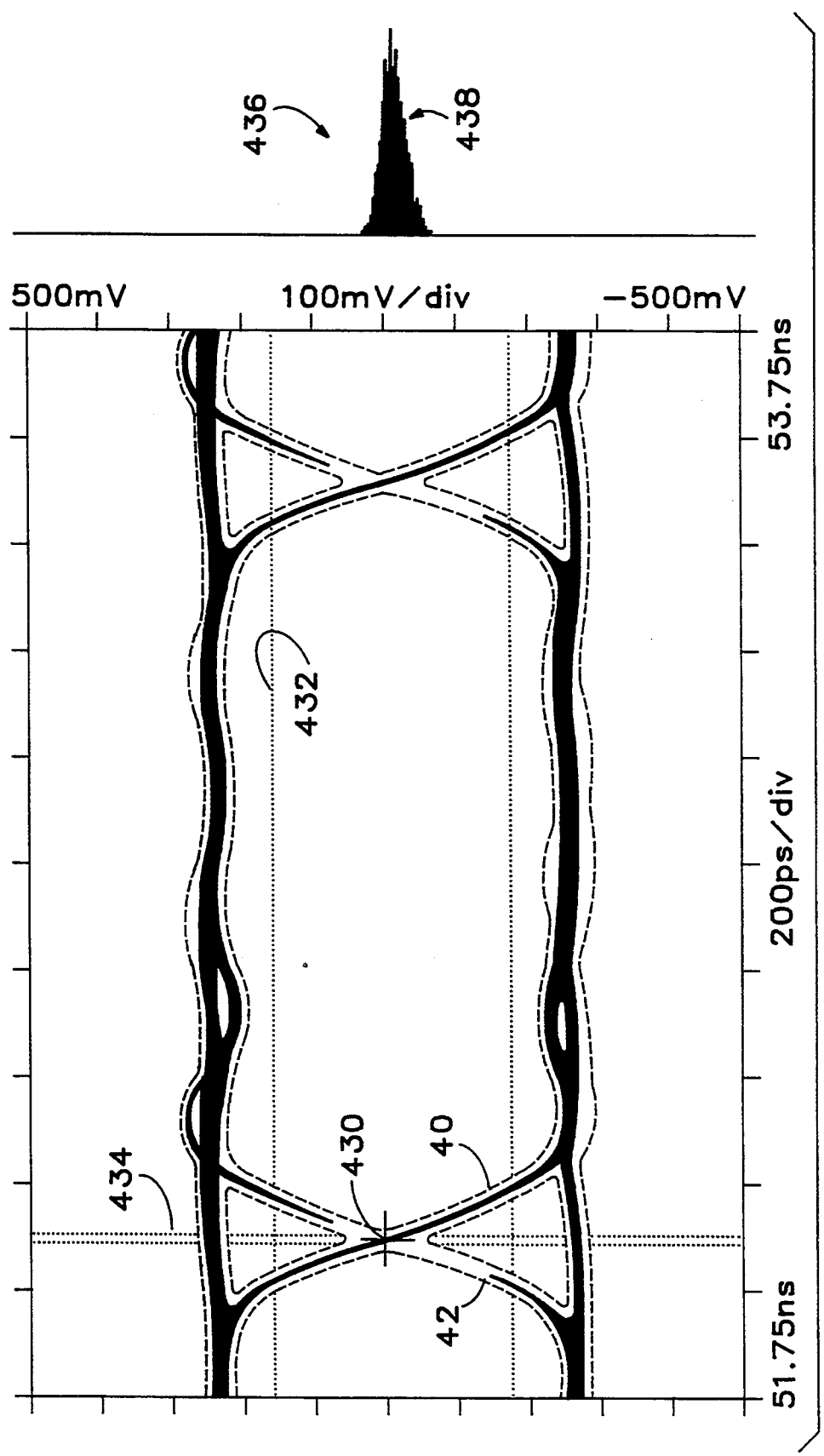

FIG. 17 illustrates the block 358 method of determining the cross-over point 430 for transition paths 40 and 42. A horizontal band 432 encompasses the full range of gain address values for array 120, but does not extend as high or as low as the state levels 34 and 36, respectively. Thus, band 432 may be centered between states 34 and 36 of signal 24. A vertical band 434 is first centered over mesial point 56, which may or may not coincide with the cross-over point 430 for paths 40 and 42. By summing selected ones of the cells 122 within both band 432 and band 434, the position of cross-over point 430 is determined. More particularly, rows of cells within bands 432 and 434, i.e., having common gain address values, are summed to build histogram 436. Histogram 436 includes a single bell-shaped structure 438 when band 434 passes substantially through cross-over point 430. However, it may be appreciated that as band 434 is positioned, the true cross-over point can be determined. Thus, it may be assumed to be at 50 percent, but may migrate 10 to 40 percent from the expected gain value.

Figure 18:
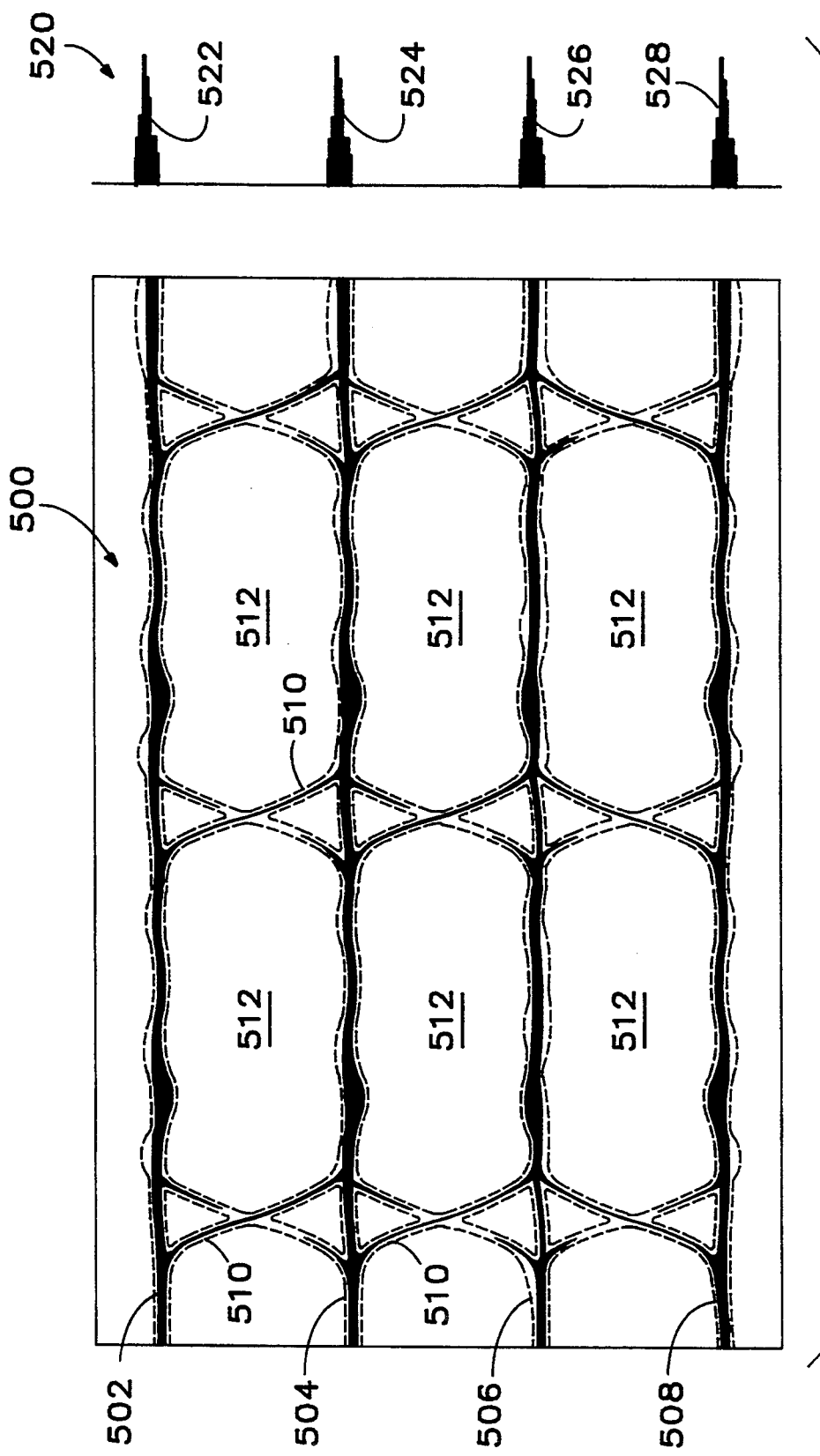

FIG. 18 illustrates an eye pattern 500 obtained from a communication signal known as a digital radio signal, a communication signal carried on a multi-valued function. In the digital radio eye pattern 500 portrayed in FIG. 18, multiple horizontal state levels 502, 504, 506 and 508 are provided and substantially vertical signal transition paths 510 exist, relative to a trigger, between such state levels. As a result, the eye pattern 500 includes an array of eyes 512, as bounded by state levels 502–508, and transition paths 510. It will be understood that the method of characterizing a signal as shown herein is applicable to analysis of the eye pattern 500. For example, the histogram 520 is obtained by first applying the eye pattern 500 to the array 120 as described above and summing rows of accumulator cells 122. Investigation of the histogram 520 yields the bell-shaped structures 522, 524, 526 and 528 corresponding to the state levels 502, 504, 506 and 508, respectively. Further analysis would include use of horizontal accumulator cell 122 bands positioned between selected ones of the state levels 502–508 to identify noise on each state level and jitter in transitions.

Thus, a method of extracting pulse parametrics and other such measurements from a multi-valued function has been shown and described. The method provides, by use of a programmable display device, automatic characterization of a communication signal without risk of human error or cost of human labor. The method may be applied to automatically characterize a signal through a broad range of variations without human supervision.

While a preferred embodiment of the present invention has been shown and described, it will be apparent to those skilled in the art that many changes and modifications may be made without departing from the invention in its broader aspects.

For example, the method of characterizing a signal shown herein has been described in connection with the signal 24 which is a nonreturn-to-zero signal. However, the method is equally applicable to other similar signals, such as return-to-zero and inverted return-to-zero. Such signals may be applied to the eye pattern database, as shown herein, by incrementing accumulator cells corresponding to display traces and summing selected portions of the array 120 in order to identify certain signal characteristics, e.g., absolute high and low state amplitudes, proximal, distal and mesial points.

The appended claims are therefore intended to cover all such changes and modifications as fall within the true spirit and scope of the invention.

We claim:

1. A method of automatically characterizing a digital communication signal having a first state, a second state and transitions therebetween that produces an eye pattern on a waveform display device, the method comprising:

initializing a data array, defined in terms of a time axis and an amplitude axis, having a plurality of elements such that each element holds a common reference value;

monitoring the digital communication signal during a sample period to obtain a time-amplitude representation of the digital communication signal during said sample period, said time-amplitude representation being in the form of a sequence of time-amplitude data points;

addressing an element of said data array for each time-amplitude data point obtained using said data point as addressing data and incrementing the value in each addressed element;

repeating the steps of monitoring and addressing for a plurality of sample periods; and summing the values held in selected elements of said data array along a selected one of the axes to characterize said digital communication signal.

2. The method according to claim 1 wherein said step of summing the values comprises the step of summing the values for a plurality of selected sequences of elements along the amplitude axis to produce a plurality of sums from which is determined first and second amplitude levels of said digital communication signal corresponding to the first and second states.

3. The method according to claim 2 wherein said step of summing the values for a plurality of selected sequences comprises the steps of:

summing the values held in each sequence of elements having a given range of first address values corresponding to the time axis and a common second address value corresponding to the amplitude axis, and selecting as the first and second amplitude levels the amplitude levels corresponding to the second address values for sequences providing relatively larger sums.

4. The method according to claim 3 wherein said step of summing the values held in selected elements further comprises the step of summing values to determine characteristics of the transitions by:

selecting bands of said sequences, each band corresponding to a set of sequences having a given range of second address values, each band corresponding to an amplitude level intermediate of and proportional to the difference between said first and second amplitude levels; and for each selected band, summing selected ones of the values from corresponding elements to determine transition characteristics.

5. The method according to claim 4 wherein said step of summing selected ones of the values from corresponding elements comprises the step of summing values held in elements in each sequence having a common first address value and having the given range of second address values.

6. A method of automatic signal analysis comprising the steps of:

receiving a digital communication signal having first and second states and transitions therebetween that produce an eye pattern on a waveform display device and digitizing a plurality of selected portions of said digital communication signal, each of said selected portions corresponding to trigger points in an associated trigger source, each of said digitized selected portions including data corresponding to time-amplitude data for representing that selected portion of said digital communication signal;

addressing with said time-amplitude data an accumulator array having a plurality of accumulator cells, each accumulator cell being addressable by an address pair, each address pair having a first address corresponding to a time portion of the corresponding time-amplitude data and a second address value corresponding to an amplitude portion of said time-amplitude data;

incrementing each address accumulator cell when addressed by said time-amplitude data; and summing the values in selected ones of said accumulator cells along one of the time and amplitude portions to characterize said digital communication signal.

7. The method according to claim 6 wherein said associated trigger source is a recovered conversion clock signal generated by reference to said digital communication signal.

8. The method according to claim 6 wherein said step of summing comprises the step of summing the values for a plurality of selected sequences of accumulator cells along the amplitude portion to produce a plurality of sums from which is determined first and second amplitude levels of said digital communication signal corresponding to the first and second states.

9. The method according to claim 8 wherein said step of summing the values for a plurality of selected sequences comprises the steps of:

summing the values held in each sequence of accumulator cells having a given range of first address values corresponding to the time portion and a common second address value corresponding to the amplitude portion, and selecting as the first and second amplitude levels the amplitude levels corresponding to the second address values for sequences of said accumulator cells providing relatively larger sums.

10. The method according to claim 9 wherein said step of summing the values in selected ones of said accumulator cells further comprises the step of summing values to determine characteristics of the transitions by:

selecting bands of said sequences, each band corresponding to a set of sequences having a given range of second address values, each band corresponding to an amplitude level intermediate of and proportional to the difference between said first and second amplitude levels; and summing selected ones of the values from said accumulator cells corresponding to selected bands to determine transition characteristics.

11. The method according to claim 10 wherein said step of summing selected ones of the values from said accumulator cells comprises the step of summing values held in accumulator cells in each sequence having a common first address value and having the given range of second address values.

12. An apparatus for automatically characterized a digital communication signal including state levels and transition paths that produce an eye pattern on a waveform display device, the apparatus comprising:

means for receiving said digital communication signal and an associated trigger signal;

means for storing a representation of said digital communication signal, said representation including an accumulator array having accumulator cells, each accumulator cell corresponding to portions of said digital communication signal having a common time offset relative to trigger points taken from said trigger signal and corresponding to portions of said digital communication signal having common amplitude values, each accumulator cell holding a value corresponding to the number of occurrences of said digital communication signal having the corresponding time offset and amplitude values; and means for summing the values from selected ones of said accumulator cells along one of the time offset and amplitude portions for characterizing said digital communication signal.

13. The apparatus according to claim 12 wherein said summing means comprises means for summing accumulator cell values along the amplitude portion for a plurality of selected sequences of accumulator cells to produce a plurality of sums from which is determined amplitude levels of said digital communication signal corresponding to the state levels.

14. The apparatus according to claim 13 wherein said means for summing accumulator cell values for a plurality of selected sequences comprises:

means for summing the values held in each sequence of accumulator cells having a given range of first address values corresponding to the time offset portion and a common second address value corresponding to the amplitude portion, and means for selecting as the amplitude levels for the state levels the amplitude levels corresponding to the second address values for sequences of said accumulator cells providing relatively larger sums.

15. The apparatus according to claim 14 wherein said means for summing the values in selected ones of said accumulator cells further comprises means for summing values to determine characteristics of the transitions including:

means for selecting bands of said sequences, each band corresponding to a set of sequences having a given range of second address values, each band corresponding to an amplitude level intermediate of and proportional to the difference between said first and second amplitude levels; and for each selected band, means for summing selected ones of the values from corresponding accumulator cells t determine transition characteristics of said digital communication signal.

16. The apparatus according to claim 15 wherein said means for summing selected ones of the values from corresponding accumulator cells comprises means for summing values held in accumulator cells in each sequence having a common first address value and having the given range of second address values.

* * * * *